US008702920B2

(12) United States Patent
Ikejiri et al.

(10) Patent No.: US 8,702,920 B2
(45) Date of Patent: Apr. 22, 2014

(54) REPELLER STRUCTURE AND ION SOURCE

(75) Inventors: Tadashi Ikejiri, Kyoto (JP); Tetsuya Igo, Kyoto (JP); Takatoshi Yamashita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 354 days.

(21) Appl. No.: 12/877,170

(22) Filed: Sep. 8, 2010

(65) Prior Publication Data

US 2011/0139613 A1 Jun. 16, 2011

(30) Foreign Application Priority Data

Dec. 10, 2009 (JP) ................................ 2009-280113

(51) Int. Cl.
*C23C 14/00* (2006.01)

(52) U.S. Cl.
USPC ................................ 204/298.12; 250/423 R

(58) Field of Classification Search
USPC ................................ 204/298.12; 250/423 R
See application file for complete search history.

(56) References Cited

U.S. PATENT DOCUMENTS

| | | | | |
|---|---|---|---|---|
| 4,842,703 | A * | 6/1989 | Class et al. | 204/192.12 |
| 4,957,605 | A * | 9/1990 | Hurwitt et al. | 204/192.12 |
| 5,080,772 | A * | 1/1992 | Hurwitt et al. | 204/192.12 |
| 5,497,005 | A | 3/1996 | Medulla et al. | |
| 6,583,544 | B1 | 6/2003 | Horsky et al. | |
| 6,768,121 | B2 | 7/2004 | Horsky et al. | |
| 2003/0136671 | A1* | 7/2003 | Heinz et al. | 204/298.19 |
| 2004/0000651 | A1* | 1/2004 | Horsky et al. | 250/492.21 |
| 2006/0163489 | A1* | 7/2006 | Low et al. | 250/426 |
| 2010/0051825 | A1 | 3/2010 | Yamashita et al. | |

* cited by examiner

*Primary Examiner* — Keith Hendricks
*Assistant Examiner* — Ibrahime A Abraham
(74) *Attorney, Agent, or Firm* — Procopio, Cory, Hargreaves & Savitch LLP

(57) ABSTRACT

A repeller structure is provided in a plasma generating chamber of an ion source facing a cathode that emits electrons for ionizing a source gas in the plasma generating chamber to generate a plasma. The repeller structure reflects the ions toward the cathode. The repeller structure includes a sputtering target that is sputtered by the plasma to emit predetermined ions, the sputtering target including a through hole that connects a sputtering surface and a back surface of the sputtering target; and an electrode body that is inserted in the through hole, the electrode body including a repeller surface that is exposed to the sputtering surface side through the through hole.

5 Claims, 6 Drawing Sheets

REPELLER STRUCTURE AND ION SOURCE

BACKGROUND OF THE INVENTION

1. Field of the Invention

The present invention relates to an ion source. More particularly, the present invention relates to a repeller structure configured to be mounted in a plasma generating chamber of an ion source. Such a repeller structure is typically arranged opposite to a cathode that emits electrons to repel the electrons toward the cathode.

2. Description of the Related Art

In recent years, a technique is considered in which, a source gas is ionized in a plasma generating chamber of an ion source by a cathode to generate a plasma and a sputtering target is sputtered by the plasma to cause desired ion species to be contained in an ion beam.

Specifically, as described in Japanese Patent Application Laid-open No. 2002-117780, a sputtering target provided at an end portion of a repeller is held in a replaceable manner to make it possible to generate stable ion species. The detailed structure includes a tubular repeller and a sputtering target (slug) that is contained in the end portion of the repeller. A step portion protruding inwards is provided on an inner peripheral surface of the end portion of the repeller, and a latch portion that latches the step portion is provided on an outer peripheral surface of the sputtering target. The sputtering target is fixed in the repeller by screwing a screw block that screws the sputtering target with a thread portion formed on the inner peripheral surface of the repeller from the upper part of the repeller in a state in which the latch portion of the sputtering target and the step portion of the repeller are latched together.

However, because the outer peripheral surface of the sputtering target is fixed by the repeller in a limited space in a plasma generating chamber, there is restriction in the size of the repeller. That also causes the size of the sputtering target to be contained in the repeller to be restricted, which leads to a problem that it is difficult to increase the surface area of the sputtering target.

There is another problem that a larger repeller must be used because the repeller is arranged on the outer peripheral surface of the sputtering target. Furthermore, because the thread portion is provided on the tubular inner surface of the repeller, not only the structure of the repeller becomes complicated, but also material cost and processing cost could increase if the repeller is manufactured by machining a single workpiece.

In addition, because the repeller is arranged on the outer circumference of the sputtering target with respect to electrons emitted from the cathode, a member facing a portion from where the electrons are emitted from the cathode becomes the sputtering target, resulting in a problem that the electron reflection efficiency is degraded, and as a result, the plasma generation efficiency is degraded.

SUMMARY OF THE INVENTION

The present invention has been achieved to solve at least the above problems. An object of the present invention is to make the dimension of the sputtering surface as large as possible. Another object is to simplify a mounting structure of the sputtering target. Still another object is to enhance the reflection efficiency of the electrons emitted from the cathode while maintaining compact size of the repeller structure.

A repeller structure according to an aspect of the present invention is provided in a plasma generating chamber of an ion source and arranged facing a cathode that emits electrons for ionizing a source gas to generate a plasma, reflects the electrons to the cathode, and when sputtered by the plasma it emits predetermined ions. The repeller structure includes a sputtering target having a through hole that connects a sputtering surface and a back surface of the sputtering target, and an electrode body that is inserted into the through hole of the sputtering target. The electrode body includes a repeller surface that is exposed to the sputtering surface side through the through hole.

With the above configuration, because the through hole is provided on the sputtering target and the electrode body is inserted in the through hole, a surface area of the sputtering surface of the sputtering target can be increased as large as possible regardless of the configuration of the repeller in the plasma generating chamber, which makes it possible to generate ions in a stable manner for a long time. Furthermore, because it is possible not only to downsize the electrode body but also to fix the sputtering target to the electrode body with a simple structure, a replacement operation of the sputtering target can be easily performed. In addition, because the repeller surface is exposed through the through hole of the sputtering target, the repeller surface can be arranged facing the portion to which the electrons are emitted, and the reflection efficiency of the electrons emitted from the cathode can be enhanced. As a result, the plasma generation efficiency can be enhanced.

It is preferable that the sputtering target includes a counterboring portion formed with a diameter larger than that of an opening of the through hole on the sputtering surface, the electrode body includes a large diameter portion on its end portion, which is engaged with the counterboring portion, and an end surface of the large diameter portion serves as a repeller surface. With this configuration, it is possible to perform a positioning of the sputtering target and the electrode body in a simple manner. Furthermore, if the repeller structure is arranged vertically downwards, it is possible to eliminate other fixing parts, which makes it possible to form the repeller structure in an extremely simple structure.

In an ion beam generating process, it is considered that wearing of the sputtering target is faster than wearing of the electrode body. From this aspect, as a result of the wearing in a production process, there may be a case in which a repeller surface is located closer to the cathode than a sputtering surface. In this case, ions in the plasma are attracted to the repeller surface that is located ahead of the sputtering surface. This makes it difficult for the ions in the plasma to collide with the sputtering surface, resulting in a degradation in the ion beam generation efficiency. To solve this problem, it is preferable that the sputtering surface be located closer to the cathode than the repeller surface in a state in which the large diameter portion of the electrode body is engaged with the counterboring portion.

In order to fix the sputtering target and the electrode body with a simple structure, it is preferable that a thread portion be formed on an outer peripheral surface of the electrode body, and by screwing a nut member with the thread portion from a back side of the sputtering target, the sputtering target be fixed by the large diameter portion and the nut member.

In order to make the ions to be evenly emitted from the sputtering target along the circumferential direction of the repeller surface without considering the precision of mounting the sputtering target in the circumferential direction, it is preferable that the sputtering target be substantially circular disk shaped and the through hole be formed substantially at the center portion of the sputtering target.

An ion source according to another aspect of the present invention includes a plasma generating chamber that is a chamber in which a plasma is generated, which serves as an anode, in which a source gas is introduced, including an ion extraction port, a cathode that is arranged on the plasma generating chamber, emitting electrons to ionize the source gas to generate the plasma, and a repeller structure that is arranged facing the cathode in the plasma generating chamber to reflect the electrons toward the cathode side. The repeller structure includes a sputtering target that emits predetermined ions by being sputtered by the plasma, including a through hole that passes through a sputtering surface and a back surface of the sputtering target and an electrode body that is inserted in the through hole of the sputtering target, including a repeller surface that is exposed to the sputtering surface side through the through hole.

In order to increase the electron reflection efficiency in the repeller surface as high as possible, it is preferable that a center of an electron emitting portion of the cathode and a center of the repeller surface be arranged substantially on the same axis.

According to the embodiments of the present invention, it is possible to increase the dimension of the sputtering surface as large as possible, enhance the reflection efficiency of the electrons emitted from the cathode, simplify the structure of mounting the sputtering target, and make the repeller structure compact.

DETAILED DESCRIPTION OF THE PREFERRED EMBODIMENTS

Exemplary embodiments of an ion source according to the present invention will be explained in detail below with reference to the accompanying drawings.

Figure 1:
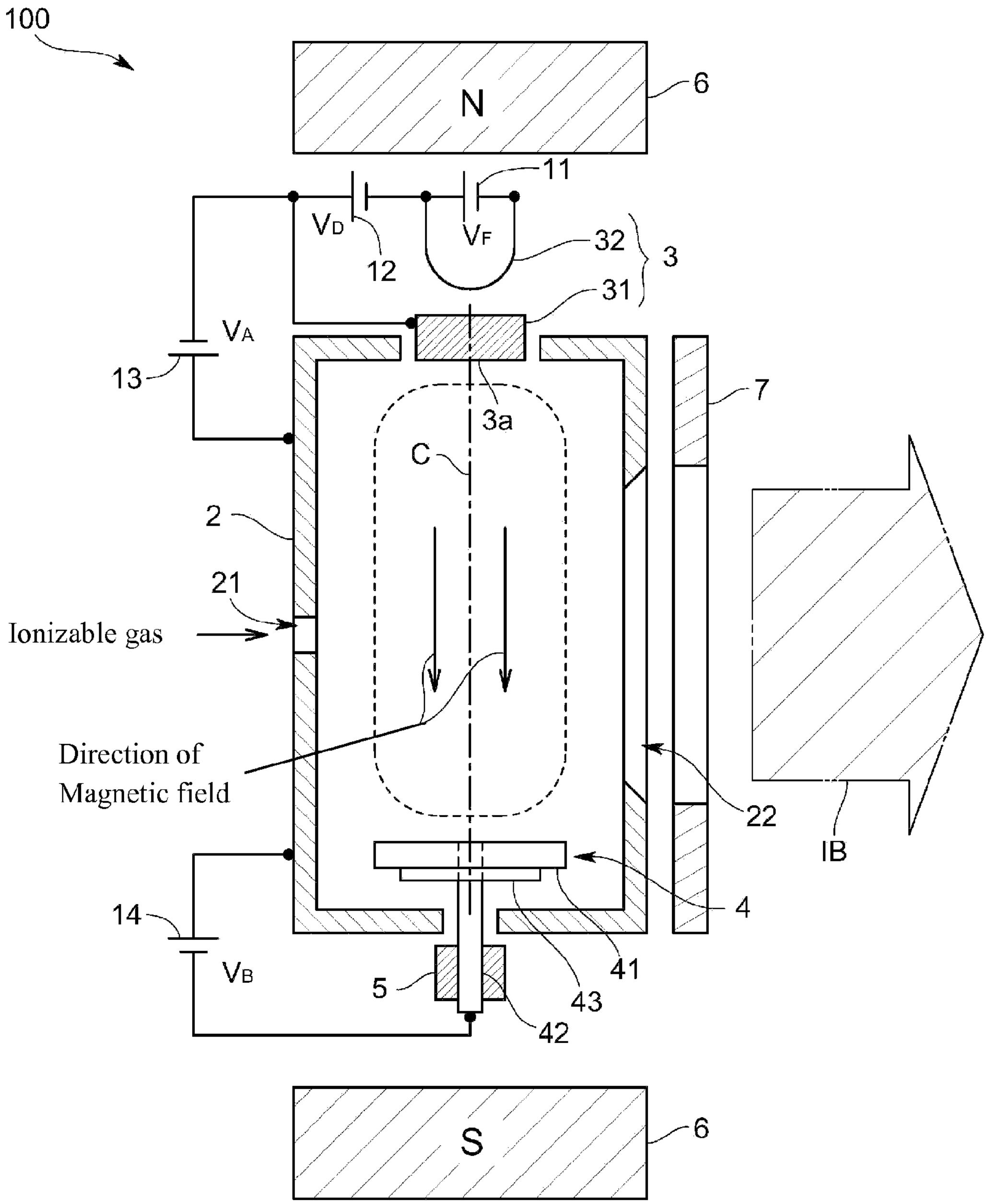
FIG. 1 is a schematic cross section of an ion source according to an embodiment of the present invention.

An ion source 100 according to an embodiment of the present invention is shown in FIG. 1. The ion source 100 generates an ion beam IB that contains predetermined ions such as aluminum ions. The ion source 100 includes a plasma generating chamber 2, an indirectly heated cathode 3 provided on the plasma generating chamber 2, and a repeller structure 4 arranged in the plasma generating chamber 2, facing the indirectly heated cathode 3.

The plasma generating chamber 2, the indirectly heated cathode 3, and the repeller structure 4 are explained in detail below.

The plasma generating chamber 2 has, for example, a rectangular cuboid shape in which a plasma is generated. The plasma generating chamber 2 also serves as an anode for arc discharge. The plasma generating chamber 2 has a gas inlet port 21 for introducing an ionizable gas as a source gas into the plasma generating chamber 2 and an ion extraction port 22 for extracting ions generated in the plasma generating chamber 2 to the outside. The gas inlet port 21 and the ion extraction port 22 are formed on a wall of the plasma generating chamber 2.

An ionizable gas containing, for example, fluorine is introduced into the plasma generating chamber 2 through the gas inlet port 21. As shown in FIG. 1, the gas inlet port 21 is located, for example, at a position facing the ion extraction port 22. However, the gas inlet port 21 can be provided at any other position as long as it permits introduction of the source gas into the plasma generating chamber 2. The reason why the ionizable gas containing fluorine is used is as follows. Fluorine reacts readily with other materials. Therefore, a strong operation of emitting predetermined ions, such as aluminum ions, from a sputtering target 41 can be achieved by a plasma in which the ionizable gas containing fluorine is ionized. The sputtering target 41 will be described later.

The ionizable gas containing fluorine is a gas including fluoride or fluorine ($F_2$), such as boron fluoride ($BF_3$), silicon tetrafluoride ($SiF_4$), germanium tetrafluoride ($GeF_4$), and the like. The ionizable gas containing fluorine can be any one of a fluoride gas itself, the fluorine itself, and a gas attenuated by an appropriate gas (for example, a helium gas).

The indirectly heated cathode 3 is arranged on one side of the plasma generating chamber 2 (the upper side in FIG. 1). The indirectly heated cathode 3 emits thermal electrons into the plasma generating chamber 2, and it is electrically insulated from the plasma generating chamber 2.

As shown in FIG. 1, the indirectly heated cathode 3 includes a cathode member 31 that emits thermal electrons when heated and a filament 32 that heats the cathode member 31.

A heating power source 11 supplies power to the filament 32. A direct-current (DC) bombardment power supply 12 is connected between the filament 32 and the cathode member 31, and it applies a voltage $V_D$ between the filament 32 and the cathode member 31. More specifically, a positive electrode of the bombardment power supply 12 is connected to the cathode member 31. The bombardment power supply 12 is operative to accelerate the thermal electrons emitted from the filament 32 toward the cathode member 31 to heat the cathode member 31 by using an impact force of the thermal electrons. A DC arc power source 13 is connected between the cathode member 31 and the plasma generating chamber 2. The arc power source 13 applies an arc voltage $V_A$ between the cathode member 31 and the plasma generating chamber 2 to generate an arc discharge between them and to generate plasma by ionizing the ionizable gas present in the plasma generating chamber 2. A positive electrode of the arc power source 13 is connected to the plasma generating chamber 2.

The repeller structure 4 that reflects electrons (mainly the thermal electrons emitted from the indirectly heated cathode 3, hereinafter, "thermal electrons") in the plasma generating chamber 2 toward the indirectly heated cathode 3 is arranged on the other side in the plasma generating chamber 2 (the opposite side of the indirectly heated cathode 3, i.e., the lower side in FIG. 1), facing the indirectly heated cathode 3.

The repeller structure 4 is electrically insulated from the plasma generating chamber 2 via an insulator. The insulator can be an empty space as in the present embodiment, or can be some other insulating material. The repeller structure 4 includes, as shown in FIGS. 2 and 3, the sputtering target 41 that emits predetermined ions when sputtered by the plasma and an electrode body 42 that supports the sputtering target 41 and that includes a repeller surface 42X that reflects the thermal electrons.

A negative bias voltage $V_B$ with respect to a potential of the plasma generating chamber 2 is applied to the electrode body 42 from a DC bias power source 14. A magnitude of the bias voltage $V_B$ is determined by a balance between an electron reflecting operation by the electrode body 42 (repeller surface 42X) and a sputtering operation on the sputtering target 41 (a sputtering surface 41A, i.e., a surface to be sputtered, also referred to as a "sputter target surface" or "target surface") by ions in the plasma. From this point of view, it is preferable that the bias voltage $V_B$ be, for example, in the range of about 40 volts to 150 volts. If the ionizable gas is a gas containing boron fluoride ($BF_3$), it is more preferable that the bias voltage $V_B$ be, for example, in the range of about 60 volts to 120 volts.

The sputtering target 41 emits predetermined ions when it is exposed to the plasma. The sputtering target 41 is composed of aluminum oxide ($Al_2O_3$) and generates an aluminum ion beam IB. However, some other sputtering target may be used.

Figure 2:
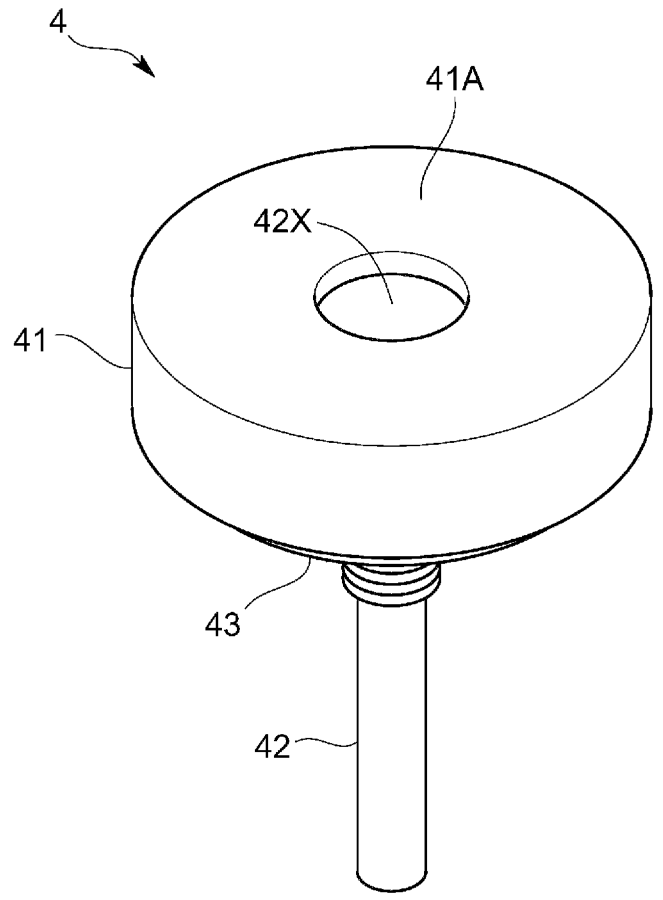
FIG. 2 is a schematic perspective view of a repeller structure according to the embodiment.
Figure 3:
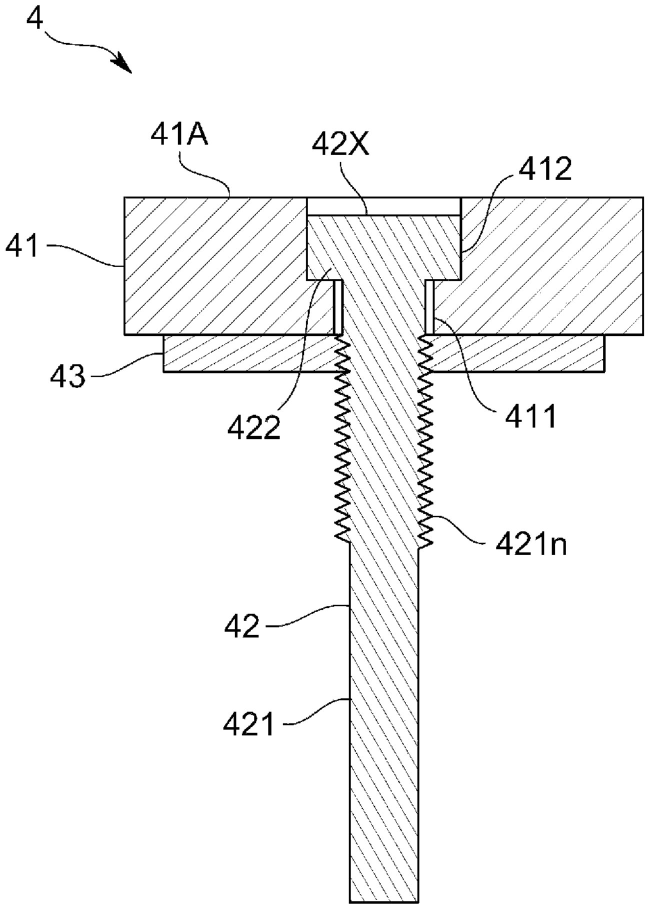
FIG. 3 is a schematic cross section of the repeller structure shown in FIG. 2.
Figure 4:
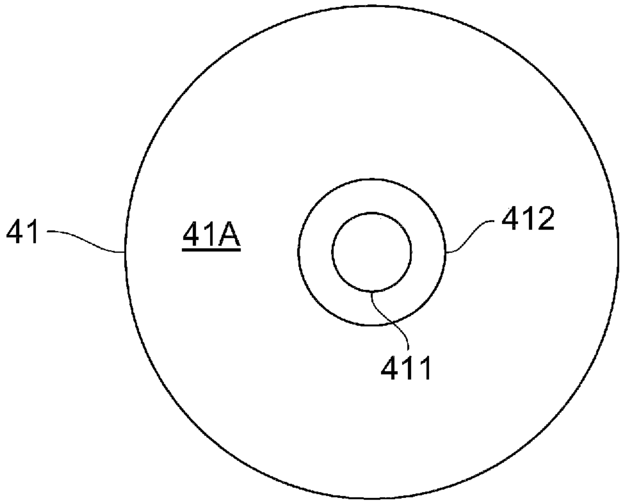
FIG. 4 is a schematic plan view of a sputtering target according to the present embodiment.

Specifically, as shown in FIGS. 2 to 4, the sputtering target 41 is substantially circular disk shaped. A through hole 411 that connects the sputtering surface 41A, which is a surface to be sputtered, and its back surface, is formed substantially at a center portion of the sputtering target 41. The through hole 411 is a circular hole having substantially the same cross sectional shape as the electrode body 42 that will be described later. However, the through hole 411 can have a different shape than the shape mentioned above.

As the sputtering target 41 for generating the aluminum ion beam IB, an aluminum compound such as aluminum nitride (AlN) can also be used. According to a type of the ion beam IB, a material containing desired ions can be used as the sputtering target 41.

The sputtering target 41 includes a counterboring portion 412 formed with a diameter larger than that of an opening of the through hole 411 on the sputtering surface 41A side. The counterboring portion 412 is formed in a concentric manner with the through hole 411. That is, the sputtering target 41 according to the present embodiment makes a shape of rotating body.

The electrode body 42 has substantially a cylindrical shape, as shown in FIGS. 2 and 3. The electrode body 42 has a small diameter portion 421 and a large diameter portion 422. The small diameter portion 421 has an outer diameter that can be freely inserted in the through hole 411 in a removable manner. The large diameter portion 422 has an outer diameter larger than that of the small diameter portion 421 so that it cannot be inserted in the through hole 411 and it engages with the counterboring portion 412.

A cross section (a circular shape in the present embodiment) of the large diameter portion 422 perpendicular to its center axis substantially matches a cross section (a circular shape in the present embodiment) of the counterboring portion 412 perpendicular to its center axis. The large diameter portion 422 fits in the counterboring portion 412 without a backlash, or with a slight backlash. In this manner, because the sputtering target 41 and the electrode body 42 make a shape of rotating body, the electrode body 42 can be inserted in the through hole 411 so that the large diameter portion 422 can fit in the counterboring portion 412, regardless of a relative position between the electrode body 42 and the sputtering target 41 in the radial direction. With this arrangement, an assembly operation and an operation of replacing the sputtering target 41 can be simplified.

The electrode body 42 is formed by cutting, for example, a workpiece that has a circular shape of uniform cross section. As for a material for the electrode body 42, for example, a material with a high melting point, such as titanium (Ti), tantalum (Ta), tungsten (W), molybdenum (Mo), carbon (C), and the like or an alloy of these materials can be used.

Furthermore, an end surface of the large diameter portion 422 (top surface in FIGS. 2 and 3) serves as the repeller surface 42X. Therefore, the repeller surface 42X is exposed to the sputtering surface 41A side on which the electrode body 42 and the sputtering target 41 are coupled to each other. In other words, the repeller surface 42X is visible from the sputtering surface 41A side when the large diameter portion 422 is engaged with the counterboring portion 412. With this configuration, an electric field can directly act on the electrons emitted from the indirectly heated cathode 3, making it possible to enhance the electron reflection efficiency.

Moreover, a length of the large diameter portion 422 along the central axis is made shorter than a length of the counterboring portion 412 along the central axis. Thus, the sputtering surface 41A is located closer to the indirectly heated cathode 3 than the repeller surface 42X when the large diameter portion 422 is engaged with the counterboring portion 412. With this configuration, it is possible to prevent a decrease of the ion beam generation efficiency in an ion beam generating process by preventing a decrease of the sputtering efficiency that can be caused if the repeller surface 42X is located closer to the indirectly heated cathode 3 than the sputtering surface 41A. As a result, it is possible to supply the ion beam IB in a stable manner for a long time.

A thread portion 421*n* is formed on the outer peripheral surface of a part or the whole of the electrode body 42 except for the large diameter portion 422 (i.e., a part or whole of the small diameter portion 421 along the central axis) (see FIG. 3). A nut member 43 can be screwed with the thread portion 421*n* from a back side of the sputtering target 41. When the nut member 43 is screwed, the sputtering target 41 is fixed by the large diameter portion 422 and the nut member 43. With this configuration, the sputtering target 41 is prevented from falling off from the electrode body 42. In this case, it is sufficient that the thread portion 421*n* be formed in a range in which the sputtering target 41 can be supported by the large diameter portion 422 and the nut member 43. As shown in FIG. 3, it is sufficient to form the thread portion 421*n* in a range in which the screwing of the nut member 43 can be made in a state in which the large diameter portion 422 is engaged with the counterboring portion 412.

Figure 5:
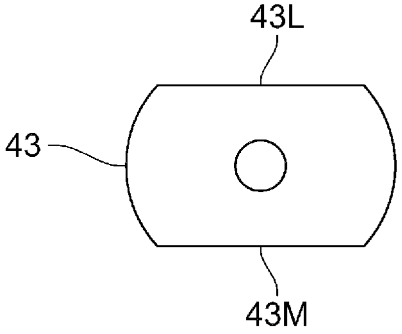
FIG. 5 is a schematic plan view of a nut member according to the present embodiment.

The nut member 43 is, as shown in FIG. 5, substantially annular shaped and it is made of, for example, a material with a high melting point, such as titanium (Ti), tantalum (Ta), tungsten (W), molybdenum (Mo), carbon (C), and the like. Although the nut member 43 is prone to be formed in an annular shape considering problems in manufacturing process and manufacturing cost, it is cut to have at least sides 43L and 43M on opposite sides to make a tightening operation easy. It is easier for a user to tight the nut member 43 when it has such a shape.

The repeller structure 4 configured in the above manner is held by a holding mechanism 5. The holding mechanism 5 is a clamp provided outside the plasma generating chamber 2, and arranged in such a manner that a center of an electron emitting portion 3*a* of the indirectly heated cathode 3 and a center of the repeller surface 42X are located substantially on the same axis (a center axis C) (see FIG. 1). The holding mechanism 5 is positioned with respect to the plasma generating chamber 2 in such a manner that the center of the repeller surface 42X and the center of the electron emitting portion 3*a* of the indirectly heated cathode 3 are arranged substantially on the center axis C in a state of holding the repeller structure 4. The holding mechanism 5 holds an edge side of the electrode body 42 of the repeller structure 4 where the sputtering target 41 is not connected. With this configuration, the center of the repeller surface 42X and the center of the electron emitting portion 3*a* of the indirectly heated cathode 3 are arranged substantially on the same axis (the center axis C), so that the electron reflection efficiency can be enhanced. In the present embodiment, a space is ensured between the plasma generating chamber 2 and the repeller structure 4 that is held by the holding mechanism 5, and this space serves as an insulator that electrically insulates the repeller structure 4 from the plasma generating chamber 2.

The ion extraction port 22 is formed in an elongated slit shape formed along the center axis C. Because the ion extraction port 22 is formed along the center axis C, the ion beam generation efficiency can be enhanced.

Furthermore, a magnet 6 that generates a magnetic field along a line that connects the indirectly heated cathode 3 and the repeller structure 4 (specifically, the sputtering target 41) in the plasma generating chamber 2 is provided outside the plasma generating chamber 2. The magnet 6 is, for example, an electromagnet, but can be a permanent magnet. It is needless to say that the direction of the magnetic field can be opposite to a direction shown in FIG. 1.

Due to the existence of the repeller structure 4 and the magnetic field as described above, the electrons in the plasma generating chamber 2 move back and forth between the indirectly heated cathode 3 and the repeller structure 4 while circling in the magnetic field with the direction of the magnetic field as its rotating axis. As the electrons move, the probability that the electrons and gas molecules of an ionizable gas collide with each other increases so that an ionization probability of the ionizable gas increases. Therefore, the plasma generation efficiency is enhanced. In other words, it is possible to generate a high density plasma between the indirectly heated cathode 3 and the repeller structure 4.

An extracting electrode system 7 for extracting the ion beam IB from the plasma generating chamber 2 (more specifically, from the plasma generated in the plasma generating chamber 2) is provided near an outlet portion of the ion extraction port 22. As shown in FIG. 1, the extracting electrode system 7 includes a single electrode. However, the extracting electrode system 7 can include a plurality of electrodes.

In the ion source 100, the sputtering target 41 consisting of aluminum oxide is exposed to the plasma that is generated by ionizing the ionizable gas containing fluorine. Aluminum particles, such as aluminum ions and the like, are emitted from the sputtering target 41 into the plasma by an erosion by fluorine ions, fluorine radicals, or the like in the plasma or a sputtering by ions, such as the fluorine ions and the like, in the plasma, so that the aluminum ions are contained in the plasma. The aluminum particle emitted from the sputtering target 41 includes a particle that is emitted as the aluminum ion and a particle that is emitted as a neutral aluminum atom. The neutral aluminum atom also collides with the electrons in the plasma so that it is ionized to become an aluminum ion. In this manner, the plasma contains the aluminum ions (for example, $Al^{+}$, $Al^{2+}$, and $Al^{3+}$). As a result, the ion beam IB containing the aluminum ions is generated.

With the ion source 100 according to the present embodiment, because the through hole 411 is formed in the sputtering target 41 and the sputtering target 41 is supported by inserting the electrode body 42 in the through hole 411, it is possible to increase the surface area of the sputtering surface 41A of the sputtering target 41 as large as possible without constricting the structure of the electrode body 42 in the plasma generating chamber 2, which makes it possible to generate the ions in a stable manner for a longer time. Furthermore, because not only the electrode body 42 can be made compact but also the sputtering target 41 can be fixed to the electrode body 42 with a simple structure, a replacement operation of the sputtering target 41 can be easily performed. Moreover, because the repeller surface 42X is exposed through the through hole 411 of the sputtering target 41, the repeller surface 42X can be arranged facing the portion to which the electrons are emitted from the indirectly heated cathode 3, and the reflection efficiency of the electrons emitted from the indirectly heated cathode 3 can be enhanced. As a result, the plasma generation efficiency can be enhanced, and eventually, the generation efficiency of the ion beam IB can be enhanced.

The present invention is not limited to the above embodiments.

For example, the sputtering target 41 and the electrode body 42 in the repeller structure 4 can be coupled to each other in a different manner than that is explained above.

For example, the repeller structure can have a configuration shown in FIGS. 6A to 6D.

Figure 6A:
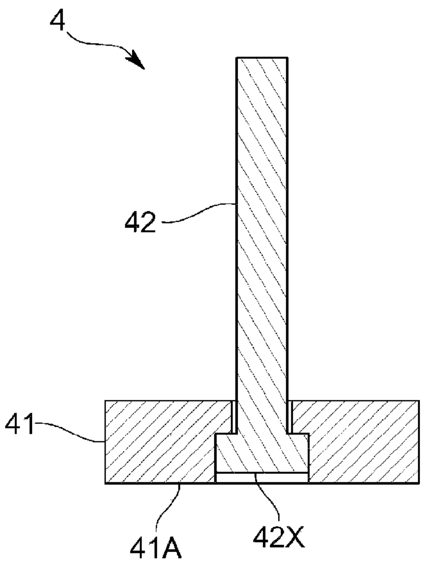
FIGS. 6A to 6D are schematic cross sections of repeller structures according to modification examples of the present embodiment.

As shown in FIG. 6A, a repeller structure 4 can be mounted vertically downwards (the indirectly heated cathode 3 and the repeller structure 4 are arranged in opposite positions to those in FIG. 3). In this arrangement, it is not necessary to use the nut member 43. It is also not necessary to provide the thread portion 421*n* on the electrode body 42. This arrangement is more simple and has lesser number of parts.

Figure 6B:
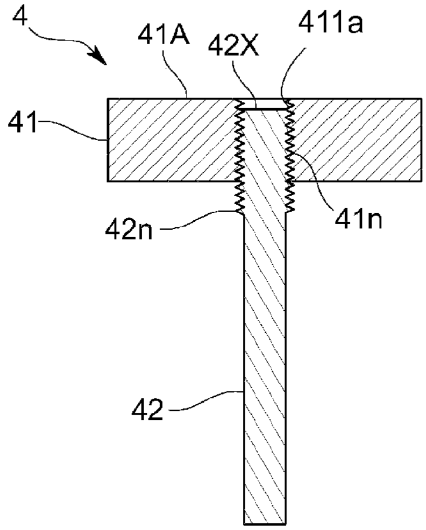

Furthermore, as shown in FIG. 6B, in a repeller structure 4, the sputtering target 41 and the electrode body 42 can be coupled to each other by forming a thread portion 41*n* on an inner peripheral surface of the through hole 411*a* of the sputtering target 41, forming a thread portion 42*n* on a tip portion of the electrode body 42, and screwing the thread portion 41*n* and the thread portion 42*n* together. In this case, an insertion side end surface of the electrode body 42 becomes the repeller surface 42X.

Figure 6C:
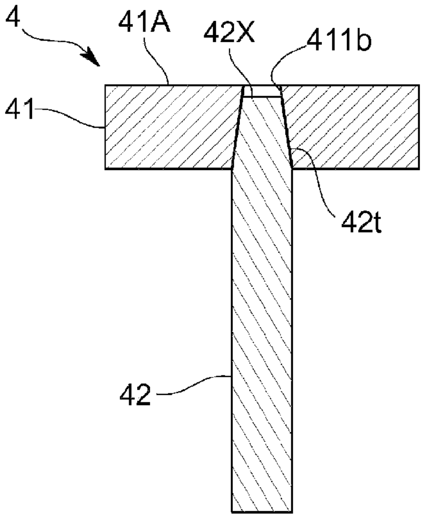

Moreover, as shown in FIG. 6C, in a repeller structure 4, by forming the through hole 411*b* of the sputtering target 41 in a tapered manner such that the diameter of the through hole 411*b* increases in a downward direction, forming the tip portion 42*t* of the electrode body 42 in a tapered manner such that the diameter of the tip portion 42*t* decreases in an upward direction, the sputtering target 41 and the electrode body 42 can be coupled to each other by fitting a tapered portion of the electrode body 42 in the through hole 411*b*. In this case, an insertion side end surface of the electrode body 42 becomes the repeller surface 42X. With this configuration, the structure can be further simplified, because it is not necessary to form the thread portion, reducing the number of necessary parts. It is also acceptable that the tapered portion is formed on either the through hole 411*b* or the electrode body 42, and the through hole 411*b* and the electrode body 42 are engaged with each other in a state in which the tip portion of the electrode body 42 is inserted in the through hole 411*b*.

Figure 6D:
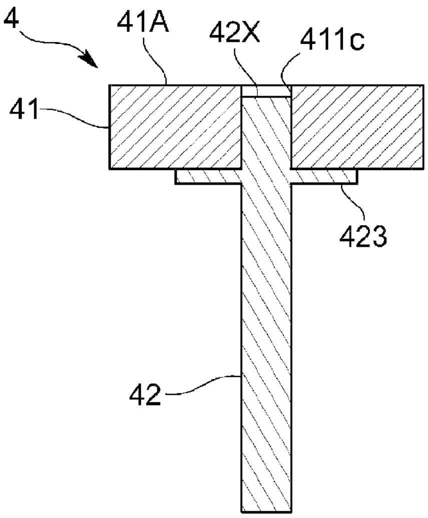

In addition, as shown in FIG. 6D, in a repeller structure 4, a supporting portion 423 that supports the sputtering target 41 from underneath is provided on the electrode body 42. The sputtering target 41 is supported by the supporting portion 423 such that the sputtering target 41 does not fall down in a state in which the tip portion of the electrode body 42 is inserted in the through hole 411*c* of the sputtering target 41. In this case, an insertion side end surface of the electrode body 42 becomes the repeller surface 42X. With this configuration, it is not necessary to form the thread portion on the electrode body 42 and the sputtering target 41, making it possible to simplify the whole configuration.

Figure 7A:
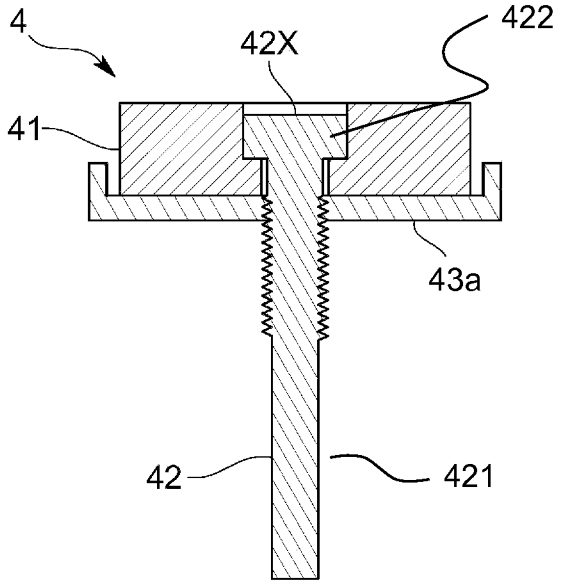
FIGS. 7A and 7B are schematic cross sections of repeller structures according to further modification examples of the present embodiment.

The nut member 43 can have various other configurations. For example, as shown in FIG. 7A, a nut member 43*a* can be configured to cover the whole bottom surface of the sputtering target 41 in a state in which the nut member 43*a* and the large diameter portion 422 fix the sputtering target 41. With this configuration, even when the sputtering target 41 is damaged, it is possible to prevent debris from falling down, which makes it possible to prevent a decrease of the ion generation efficiency by the sputtering. The nut member 43*a* can be formed, for example, in a dish shape that covers the outer circumference of the sputtering target 41.

Figure 7B:
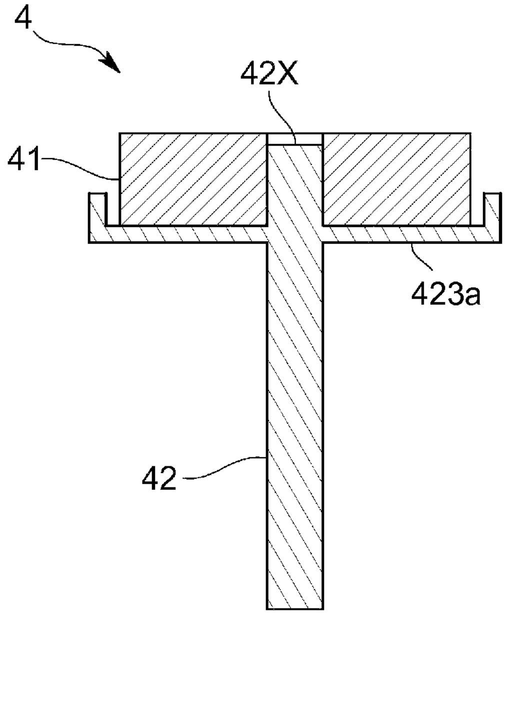

In the configuration of not using the nut member 43, a supporting portion 423*a* can be configured to cover the whole bottom surface of the sputtering target 41, as shown in FIG. 7B. Alternatively, the supporting portion 423*a* can be formed in a dish shape to cover the outer circumference of the sputtering target 41. An integration of the supporting portion 423*a* with the electrode body 42 may increase the manufacturing cost. To solve this problem, a body member of the electrode body 42 and a supporting member that makes up the supporting portion 423*b* can be manufactured in a separate manner and then the body member can be tightly inserted in a hole of the supporting member.

Furthermore, although an indirectly heated cathode was used in the above embodiment, a directly heating cathode can also be used instead.

Moreover, instead of fixing the repeller structure by the holding mechanism, the repeller structure can be fixed to the plasma generating chamber via an insulator.

The sputtering target need not be in a circular disk shape, but can have various other shapes. There is no limitation on the cross sectional shape of the electrode body. It is sufficient that it can be inserted in the through hole formed on the sputtering target.

The present invention is not to be limited to the above embodiments, but is to be construed as embodying all modifications and alternative constructions that may occur to one skilled in the art that fairly fall within the basic teaching herein set forth.

What is claimed is:

1. An ion source comprising:

a plasma generating chamber that is a chamber in which a plasma is generated, which serves as an anode, and in which a source gas is introduced, the plasma generating chamber including an ion extraction port;

a cathode that is arranged on the plasma generating chamber and emits electrons inside the plasma generating chamber to ionize the source gas to generate the plasma; and a repeller structure that is arranged facing the cathode in the plasma generating chamber to reflect the electrons toward the cathode, wherein the repeller structure includes a sputtering target that is sputtered by the plasma to emit predetermined ions, the sputtering target including a through hole that connects a sputtering surface and a back surface of the sputtering target; and an electrode that is inserted in the through hole, the electrode including a repeller surface that is exposed to the sputtering surface side through the through hole, wherein the sputtering target and the electrode directly contact each other, and are electrically conductive with respect to each other, and a center of an electron emitting portion of the cathode and a center of the repeller surface are arranged substantially on a same axis, and wherein a magnet is provided outside the plasma generating chamber to generate the magnetic field along a line that connects the cathode to the repeller positioned in the plasma generating chamber, the magnetic field being parallel to the axis in the plasma generating chamber, so as to cause electrons to move back and forth between the cathode and the repeller while circling the magnetic field, with the direction of the magnetic field as its rotating axis, and an ion extraction port is arranged on the plasma generating chamber parallel to the axis.

2. The ion source according to claim 1, wherein the sputtering target further includes a counterboring portion that is formed with a diameter larger than that of an opening of the through hole on the sputtering surface, the electrode include a large diameter portion that is formed on an end portion of the electrode and is engaged with the counterboring portion, and an end surface of the large diameter portion serves as the repeller surface.

3. The ion source according to claim 2, wherein the sputtering surface is located closer to the cathode than the repeller surface in a state in which the large diameter portion is engaged with the counterboring portion.

4. The ion source according to claim 2, wherein the electrode has a thread portion on an outer peripheral surface thereof, and the repeller structure further includes a nut member which when screwed with the thread portion from a back side of the sputtering target causes the sputtering target to be fixed by the large diameter portion and the nut member.

5. The ion source according to claim 1, wherein the sputtering target is formed substantially in a circular disk shape, and the through hole is formed substantially at a center portion of the sputtering target, and the sputtering surface is flat.

* * * * *